United States Patent
Raza

(10) Patent No.: US 7,738,496 B1
(45) Date of Patent: *Jun. 15, 2010

(54) DEVICE THAT PROVIDES THE FUNCTIONALITY OF DUAL-PORTED MEMORY USING SINGLE-PORTED MEMORY FOR MULTIPLE CLOCK DOMAINS

(75) Inventor: S. Babar Raza, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1225 days.

This patent is subject to a terminal disclaimer.

(21) Appl. No.: 10/773,948

(22) Filed: Feb. 6, 2004

Related U.S. Application Data

(60) Provisional application No. 60/445,872, filed on Feb. 7, 2003, provisional application No. 60/436,303, filed on Dec. 31, 2002.

(51) Int. Cl.
- *H04J 3/06* (2006.01)
- *H04J 3/04* (2006.01)
- *H04L 12/28* (2006.01)
- *H04Q 7/00* (2006.01)

(52) U.S. Cl. ............... 370/503; 370/412; 370/535; 370/314

(58) Field of Classification Search ............. 370/413, 370/412, 506, 503, 350, 419, 421, 314, 410, 370/420, 535, 537, 508, 509; 711/149, 150; 365/233, 154, 230.05

See application file for complete search history.

(56) References Cited

U.S. PATENT DOCUMENTS

| | | |
|---|---|---|
| 4,899,352 A | 2/1990 | Cucchi et al. |
| 4,965,794 A | 10/1990 | Smith |
| 4,970,499 A | 11/1990 | Ryherd et al. |
| 5,166,926 A | 11/1992 | Cisneros et al. |
| 5,247,626 A | 9/1993 | Firoozmand |
| 5,418,781 A | 5/1995 | Kaufman et al. |
| 5,444,853 A | 8/1995 | Lentz |
| 5,502,833 A | 3/1996 | Byrn et al. |
| 5,586,294 A | 12/1996 | Goodwin et al. |
| 5,625,625 A | 4/1997 | Oskouy et al. |
| 5,638,506 A | 6/1997 | Peterson et al. |
| 5,649,230 A | 7/1997 | Lentz |

(Continued)

FOREIGN PATENT DOCUMENTS

JP 01285088 A1 11/1989

(Continued)

OTHER PUBLICATIONS

USPTO Non-Final Office Action, dated Dec. 12, 2008 for U.S. Appl. No. 10/746,349.

(Continued)

*Primary Examiner*—Hanh Nguyen

(57) ABSTRACT

A device that provides the functionality of dual-ported memory using single-ported memory for multiple clock domains is described. In one embodiment, a memory device comprises two or more port synchronization logic devices, a port multiplexing logic, and a single-ported memory core. The port multiplexing logic devices synchronize information communicated between ports associated with the port synchronization logic devices and the single-ported memory core by synchronizing the information between port clocks and a core clock.

18 Claims, 5 Drawing Sheets

U.S. PATENT DOCUMENTS

| | | | |
|---|---|---|---|
| 5,778,250 A | 7/1998 | Dye | |
| 5,802,546 A | 9/1998 | Chisholm et al. | |
| 5,804,986 A | 9/1998 | Jones | |
| 5,805,808 A | 9/1998 | Hasani et al. | |
| 5,812,820 A | 9/1998 | Loram | |
| 5,815,501 A | 9/1998 | Gaddis et al. | |
| 5,822,383 A | 10/1998 | Muntz et al. | |
| 5,822,776 A * | 10/1998 | De Korte et al. | 711/167 |
| 5,881,269 A | 3/1999 | Dobbelstein | |
| 5,898,687 A | 4/1999 | Harriman et al. | |
| 5,912,898 A | 6/1999 | Khoury | |
| 5,914,757 A | 6/1999 | Dean et al. | |
| 5,963,499 A | 10/1999 | Leong et al. | |
| 5,970,229 A | 10/1999 | Thomas et al. | |
| 5,991,295 A | 11/1999 | Tout et al. | |
| 6,005,795 A | 12/1999 | Hawkins et al. | |
| 6,005,796 A | 12/1999 | Sywyk | |
| 6,047,339 A | 4/2000 | Su et al. | |
| 6,049,487 A | 4/2000 | Plants et al. | |
| 6,104,802 A | 8/2000 | Perlmutter | |
| 6,115,379 A | 9/2000 | Flanders et al. | |
| 6,131,123 A | 10/2000 | Hurst et al. | |
| 6,163,810 A | 12/2000 | Bhagavath et al. | |
| 6,163,842 A | 12/2000 | Barton | |
| 6,181,595 B1 | 1/2001 | Hawkins et al. | |
| 6,181,634 B1 | 1/2001 | Okita | |
| 6,212,597 B1 | 4/2001 | Conlin et al. | |
| 6,246,682 B1 | 6/2001 | Roy et al. | |
| 6,246,692 B1 | 6/2001 | Dai et al. | |
| 6,262,912 B1 | 7/2001 | Sywyk et al. | |
| 6,269,413 B1 | 7/2001 | Sherlock | |
| 6,292,877 B1 | 9/2001 | Ryan | |
| 6,295,295 B1 | 9/2001 | Wicklund | |
| 6,304,936 B1 | 10/2001 | Sherlock | |
| 6,339,596 B1 | 1/2002 | Kozaki et al. | |
| 6,363,077 B1 | 3/2002 | Wong et al. | |
| 6,430,088 B1 | 8/2002 | Plants et al. | |
| 6,430,626 B1 | 8/2002 | Witkowski et al. | |
| 6,504,204 B1 | 1/2003 | Hsu et al. | |
| 6,515,991 B1 | 2/2003 | McKeown | |
| 6,545,935 B1 | 4/2003 | Hsu et al. | |
| 6,560,668 B2 | 5/2003 | Ryan et al. | |
| 6,578,118 B1 | 6/2003 | Raza et al. | |
| 6,581,144 B1 | 6/2003 | Raza et al. | |
| 6,631,455 B1 | 10/2003 | Raza et al. | |
| 6,731,566 B1 | 5/2004 | Sywyk et al. | |
| 6,760,327 B1 * | 7/2004 | Manchester et al. | 370/364 |
| 6,816,955 B1 * | 11/2004 | Raza et al. | 711/168 |
| 6,822,960 B1 * | 11/2004 | Manchester et al. | 370/394 |
| 6,834,378 B2 | 12/2004 | Augsburg et al. | |
| 6,934,289 B2 | 8/2005 | Lee | |
| 7,016,349 B1 * | 3/2006 | Raza et al. | 370/390 |
| 7,193,994 B1 * | 3/2007 | Payson | 370/380 |
| 7,242,686 B1 * | 7/2007 | Dougherty et al. | 370/395.4 |
| 7,284,074 B2 | 10/2007 | Lee et al. | |
| 7,289,946 B1 | 10/2007 | Lee | |
| 2001/0014053 A1 | 8/2001 | Li | |
| 2001/0044882 A1 | 11/2001 | Pille et al. | |
| 2001/0044885 A1 | 11/2001 | Pille et al. | |
| 2002/0010897 A1 | 1/2002 | Stark | |
| 2002/0057893 A1 | 5/2002 | Wood et al. | |
| 2002/0091916 A1 | 7/2002 | Dowling | |
| 2002/0188816 A1 | 12/2002 | Johnson et al. | |
| 2004/0039938 A1 | 2/2004 | Katz et al. | |

FOREIGN PATENT DOCUMENTS

| | | |
|---|---|---|
| WO | WO2004075447 | 9/2004 |

OTHER PUBLICATIONS

USPTO Final Office Action, dated Jun. 26, 2008 for U.S. Appl. No. 10/746,349.
USPTO Non-Final Office Action, dated Dec. 26, 2007 for U.S. Appl. No. 10/746,349.
USPTO Final Office Action, dated Jul. 26, 2007 for U.S. Appl. No. 10/746,349.
USPTO Non-Final Office Action, dated Jan. 25, 2007 for U.S. Appl. No. 10/746,349.
USPTO Final Office Action, dated Jul. 24, 2006 for U.S. Appl. No. 10/746,349.
USPTO Non-Final Office Action, dated Feb. 28, 2006 for U.S. Appl. No. 10/746,349.
U.S. Appl. No. 10/746,349: "Logic for Implementing a Dual Clock Domain Read Access with Predictable timing for Bi-Directional Inputs/Outputs;" Raza; 31 pages.
Provisional U.S. Appl. No. 60/445,872: "Logic for Implementing a Dual Clock Domain Read Access with Predictable timing for Bi-Directional Inputs/Outputs;" Raza; 6 pages.
Provisional U.S. Appl. No. 60/437,303: "Dual-Port Memory Using a Single Port Memory for Multiple Clock Domain;" Raza; 9 pages.
USPTO Notice of Allowance for U.S. Appl. No. 09/676,706, dated Oct. 19, 2005; 6 pages.
USPTO Advisory Action for U.S. Appl. No. 09/676,706 dated Aug. 10, 2005, 2 pages.
USPTO Final Rejection for U.S. Appl. No. 09/676,706 dated Jun. 1, 2005; 7 pages.
USPTO Non-Final Rejection for U.S. Appl. No. 09/676,706 dated Sep. 22, 2004; 7 pages.
S. Babar Raza et al., "Architecture for Implementing Virtual Multiqueue Fifos;" U.S. Appl. No. 09/676,704; filed Sep. 29, 2000; 79 pages.
S. Babar Raza et al., "Logic for Providing Arbitration for Synchronous Dual-Port Memory;" U.S. Appl. No. 09/676,169; filed Sep. 29, 2000; 82 pages.
S. Babar Raza et al., "Logic for Initializing the Depth of the Queue Pointer Memory;" U.S. Appl. No. 09/676,705; filed Sep. 29, 2000; 82 pages.
S. Babar Raza et al., "Method and Logic for Initializing the Forward-Pointer Memory During Normal Operation of the Device as a Background Process;" U.S. Appl. No. 09/676,170, filed Sep. 29, 2000, 62 pages.
S. Babar Raza et al., "Method for Logic for Storing and Extracting in-Band Multicast Port Information Stored along with the Data in a Single Memory without Memory Read Cycle Overhead;" U.S. Appl. No. 09/676,171; filed Sep. 29, 2000; 83 pages.
S. Babar Reza et al., "Logic for Generating Multicast/Unicast Address(es);" U.S. Appl. No. 09/676,706; filed Sep. 29, 2000; 83 pages.
USPTO Notice of Allowance for U.S. Appl. No. 09/676,171 dated Dec. 6, 2002; 4 pages.
USPTO Non-Final Rejection for U.S. Appl. No. 09/676,171 dated Jun. 18, 2002; 16 pages.
Julie K. Peterson, "The Telecommunications Illustrated Dictionary," Second Edition, 2002, CRC Press; 3 pages.
USPTO Notice of Allowance for U.S. Appl. No. 09/676,170 dated Dec. 3, 2002; 5 pages.
USPTO Non-Final Rejection for U.S. Appl. No. 09/676,170 dated Aug. 15, 2002; 25 pages.
USPTO Notice of Allowance for U.S. Appl. No. 09/676,705 dated May 2, 2003; 5 pages.
USPTO Non-Final Rejection for U.S. Appl. No. 09/676,705 dated Nov. 13, 2002; 65 pages.
"Algorithm for Managing Multiple First-In, First-Out Queues from a Single Shared Random-Access Memory," IBM Technical Disclosure Bulletin, Aug. 1989; 5 pages.

USPTO Notice of Allowance for U.S. Appl. No. 09/676,169 dated Jul. 14, 2004; 4 pages.
USPTO Advisory Action for U.S. Appl. No. 09/676,169 dated Jan. 15, 2004; 1 page.
USPTO Advisory Action for U.S. Appl. No. 09/676,169 dated Dec. 11, 2003; 2 pages.
USPTO Final Rejection for U.S. Appl. No. 09/676,169 dated Sep. 24, 2003; 8 pages.
USPTO Non-Final Rejection for U.S. Appl. No. 09/676,169 dated Jun. 4, 2003; 7 pages.
USPTO Advisory Action for U.S. Appl. No. 09/676,169 dated Mar. 6, 2003; 5 pages.
USPTO Final Rejection for U.S. Appl. No. 09/676,169 dated Dec. 18, 2002; 10 pages.
USPTO Non-Final Rejection for U.S. Appl. No. 09/676,169 dated Jul. 25, 2002; 6 pages.
"A Comprehensive Dictionary of Electrical Engineering," Editor-in-Chief: Phillip A. Laplante; 1999, CRC Press; 3 pages.
Merriam Webster Online Dictionary "Separate;" retrieved on Feb. 10, 2004; 1 page.
USPTO Notice of Allowance for U.S. Appl. No. 09/676,704 dated Mar. 9, 2005; 8 pages.
USPTO Reply Brief Noted by Examiner for U.S. Appl. No. 09/676,704 dated Dec. 23, 2003; 2 pages.
USPTO Advisory Action for U.S. Appl. No. 09/676,704 dated Jul. 25, 2003; 1 page.
USPTO Advisory Action for U.S. Appl. No. 09/676,704 dated Jun. 13, 2003; 2 pages.
USPTO Final Rejection for U.S. Appl. No. 09/676,704 dated Apr. 14, 2003; 9 pages.
USPTO Non-Final Rejection for U.S. Appl. No. 09/676,704 dated Nov. 5, 2002; 6 pages.
USPTO Non-Final Rejection for U.S. Appl. No. 10/746,349 dated Sep. 17, 2009; 8 pages.
USPTO Final Rejection for U.S. Appl. No. 10/746,349 dated Jun. 8, 2009; 11 pages.
USPTO Final Rejection for U.S. Appl. No. 10/746,349 dated Feb. 18, 2010; 10 pages.
U.S. Appl. No. 10/746,349: "Logic for Implementing a Dual Clock Domain Read Access with Predictable timing for Bi-Directional Inputs/Outputs;" Raza filed on Dec. 24, 2003; 31 pages.
Provisional U.S. Appl. No. 60/445,872: "Logic for Implementing a Dual Clock Domain Read Access with Predictable timing for Bi-Directional Inputs/Outputs;" Raza filed on Feb. 7, 2003; 6 pages.
Provisional U.S. Appl. No. 60/437,303: "Dual-Port Memory Using a Single Port Memory for Multiple Clock Domain;" Raza filed on Dec. 31, 2002; 9 pages.

* cited by examiner

DEVICE THAT PROVIDES THE FUNCTIONALITY OF DUAL-PORTED MEMORY USING SINGLE-PORTED MEMORY FOR MULTIPLE CLOCK DOMAINS

RELATED APPLICATIONS

The present application is related to and claims priority from and herein incorporates by reference the U.S. provisional patent application Ser. No. 60/445,872, entitled "Dual-Port Memory Using Single Port Memory for Multiple Clock Domain", by inventor, S. Babar Raza, filed on Feb. 7, 2003. This present application is related to and herein incorporates by reference the U.S. provisional patent application Ser. No. 60/436,303, entitled "A Logic for Implementing a Dual Clock Domain Read Access with Predictable Timing for Bi-directional I/Os," by the same inventor, filed on Dec. 31, 2002. The present application is related to and herein incorporates by reference the U.S. non-provisional patent application Ser. No. 10/746,349, entitled "Logic for Implementing a Dual Clock Domain Read Access with Predictable Timing for Bi-Directional Inputs/Outputs" by the same inventor, filed on Dec. 24, 2003.

BACKGROUND OF THE INVENTION

1. Field of the Invention

Embodiments of the present invention relate to the field of electronic circuitry. More specifically, embodiments of the present invention relate to memory where dual port operation can be emulated for applications operating according to multiple clock domains using a single port memory.

2. Related Art

Random access memory cells or RAMs have become increasingly more popular due in part to the attractive costs of these devices. Many conventional RAM cells are ordinarily only addressable from a single port. In such a memory apparatus, the input of a binary address causes a single select line or coincidence of two select lines, such as a row select line and a column select line, to cause the addressed cell to be selected. Upon selection of a cell, data may then be sensed from or written into the selected storage cell on one or two bit sense lines. Alternatively, in some RAM cells, a single selection line causes the particular cell to be selected, and other selection circuitry activated by the same address causes the bit-sense lines to be selected. However, there are generally no options for addressing, sensing, and writing. The same selection lines and the same bit sense lines are always utilized to access, write to, and sense a particular location. Consequently, a single port RAM memory device cannot be simultaneously addressed and accessed from separate sources, thus, limiting access speed at which the RAM memory may be accessed.

However, certain applications require higher memory access speeds than what a single port RAM memory device can provide. Examples of such high speed applications may be graphic related memory systems such as those used in computer display systems, data transfer and buffering devices used in high speed communications systems, and memory systems used in communication with arithmetic logic units. For such applications, multi-ported random access memory devices have been developed to provide higher access speeds and increased accessibility to the memory contents of the random access memory unit. One example of a multi-ported memory device is a dual-ported RAM cell accessible simultaneously by two independent entities. In digital integrated circuits (ICs), this implies a dual-ported memory cell that can be accessed at the same time through two different ports. Each port utilizes independent sets of addresses and control lines to access the memory array using more than one clock (referred to hereinafter as "multiple clock domains") to synchronize the data from the address and control lines.

FIG. 1 depicts a block diagram of dual-ported memory. The device 100 depicted in FIG. 1, includes a dual-ported memory 130 with two ports (110, 120). Therefore, one entity can read and/or write data to dual-ported memory 130 using port 110 while another entity may simultaneously read and/or write data to dual-ported memory 130 using port 120. Each port supports a respective address bus (112, 122) and respective buses (114, 124) for data input and output (as well as port clock lines (116, 126) for controlling the synchronization of reading and/or writing data to and/or from the port data buses (114, 124). Since, device 100 has two clock lines (116, 126) for synchronizing data input and/or output, device 100 can support "multiple clock domains," enabling the processing of large amounts of data very quickly and efficiently.

Although the dual-ported memory 100 provides an effective solution for dual-port functionality, it results in large circuit designs and high development costs. For each new generation of fabrication process technology, a new dual port cell must be designed and tested, leading to additional development costs. For the same density, a dual-ported memory 100 is approximately twice the size of a single-ported memory. As performance requirements rise, more advanced technology may be required to implement a dual-ported memory than to implement a single-ported memory, rendering the conventional dual-ported memory less attractive.

FIG. 2 depicts a block diagram of another type of dual-ported memory. As depicted in FIG. 2, the dual-ported memory 200 has a port clock domain 212, which is associated with a clock signal that is received on port clock line 224, and a memory clock domain 214, which is associated with a clock signal that is communicated on clock line 226. A clock domain boundary 262 separates the port clock domain 212 from the memory clock domain 214.

Data is received by the dual-ported memory 200 at the port data bus 222. The clock signal received on port clock line 224 is used for synchronizing data received on port data bus 222. The data that is received on port data bus 222 crosses the clock domain boundary 262 through a data first-in-first-out (FIFO) 230, which is used to synchronize the data received on port address bus 222 with the memory clock domain 214.

The data is communicated from the data FIFO 230 to a memory controller 240 along bus 232. The address logic 242 of memory controller 240 generates an address that the data may be stored at in the single clock domain memory 250. Memory controller 240 communicates the data to the single clock domain memory 250, along with the generated address, and a clock signal along the respective buses (244, 246) and control line (226). Single clock domain memory 250 stores the data at the address that address logic 242 generated.

Although device 200 is size efficient it can only be used for uni-directional data flow and is most suitable for sequential data processing.

SUMMARY OF THE INVENTION

It would be advantageous to provide memory that is small and cost effective to manufacture but that has the functionality of dual-ported memory.

Accordingly, embodiments of the present invention provide the functionality of a dual-ported memory using single-ported memory for multiple clock domain applications.

Embodiments of the present invention are directed to a device that improves upon the conventional device, where size (and therefore cost), is important and where the ability to interface with multiple clock domains and perform random accesses and bi-directional accesses is important. In one embodiment, memory device comprises two or more port synchronization logic devices, a port multiplexing logic, and a single-ported memory core. The port synchronization logic devices synchronize information communicated between ports associated with the port synchronization logic devices and the single-ported memory core by synchronizing the information between port clocks and a core clock. The two ports and the core clock can operate at different frequencies. Typically, the core frequency is twice that of the fastest port frequency. In one embodiment, the core frequency is at least twice that of the fastest port frequency.

More specifically, in one embodiment the port synchronization logic devices include FIFOs for synchronizing the information communicated between the ports and the single-ported memory core. For example, the port synchronization logic devices may include read data control FIFOs, write data and control FIFOs, and address FIFOs In another embodiment, the port synchronization logic devices include multiplexers which can be used for bypassing the synchronization of the information communicated between the ports and the single-ported memory core in the event that the port clocks and the core clock are derived from the same clock source circuit.

In one embodiment, the port multiplexing logic acts as a time division multiplexer (TDM) for information communicated between the port synchronization logic devices and the single-ported memory core.

DETAILED DESCRIPTION OF THE INVENTION

Reference will now be made in detail to the preferred embodiments of the present invention, device is described that provides the functionality of a dual-ported memory using a single-ported memory for multiple clock domains, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

Figure 1:
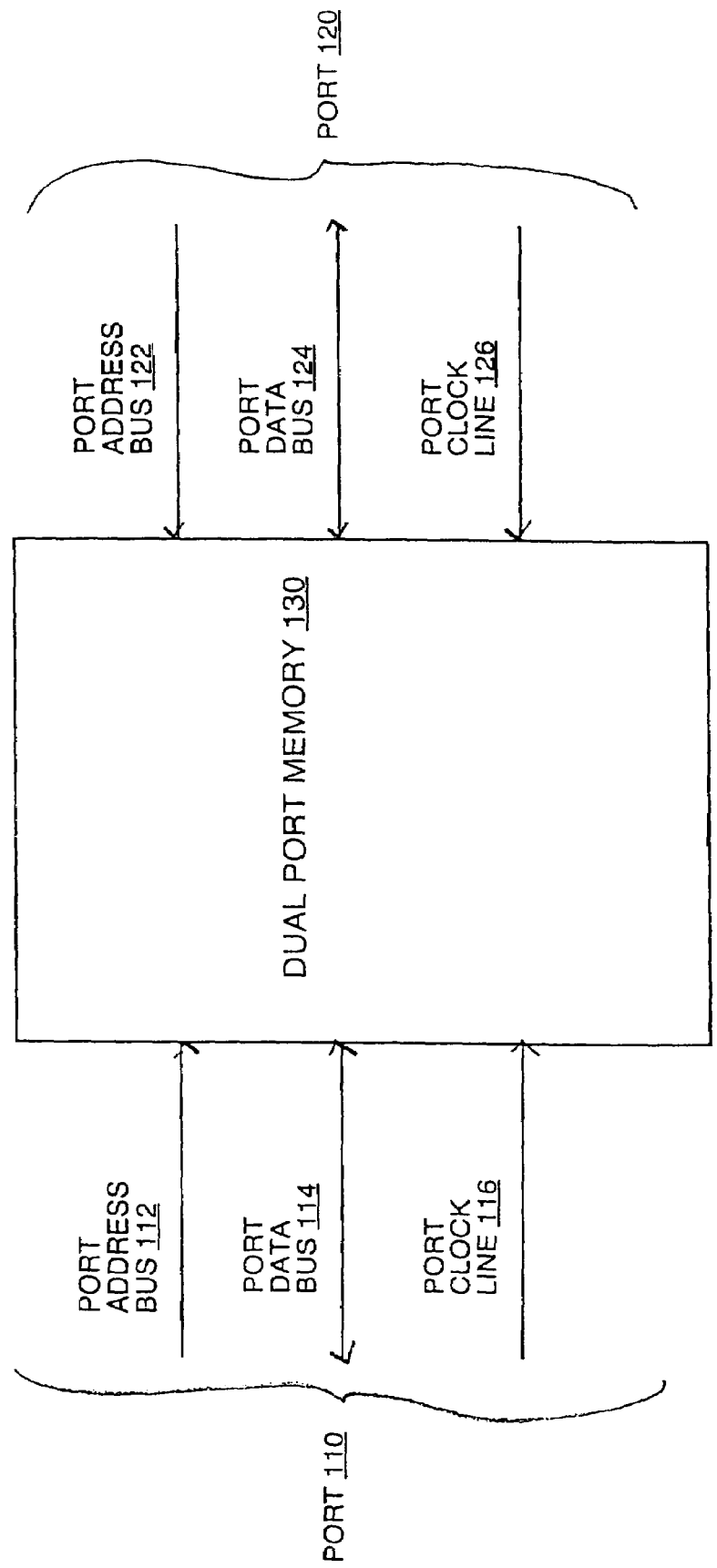
FIG. 1 depicts a block diagram of dual-ported memory of the conventional art.
Figure 2:
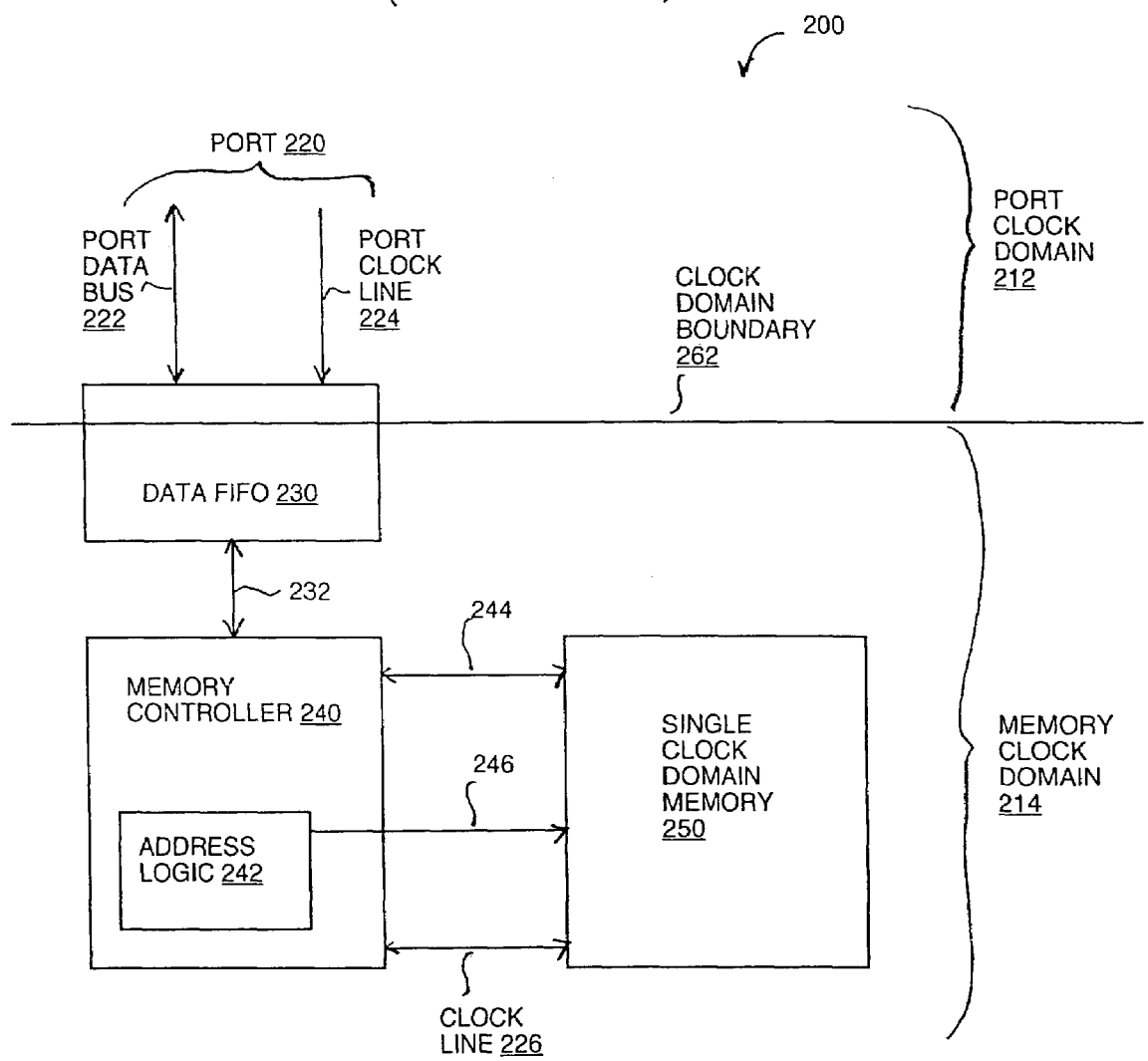
FIG. 2 depicts a block diagram of another type of dual-ported memory of the conventional art.
Figure 3:
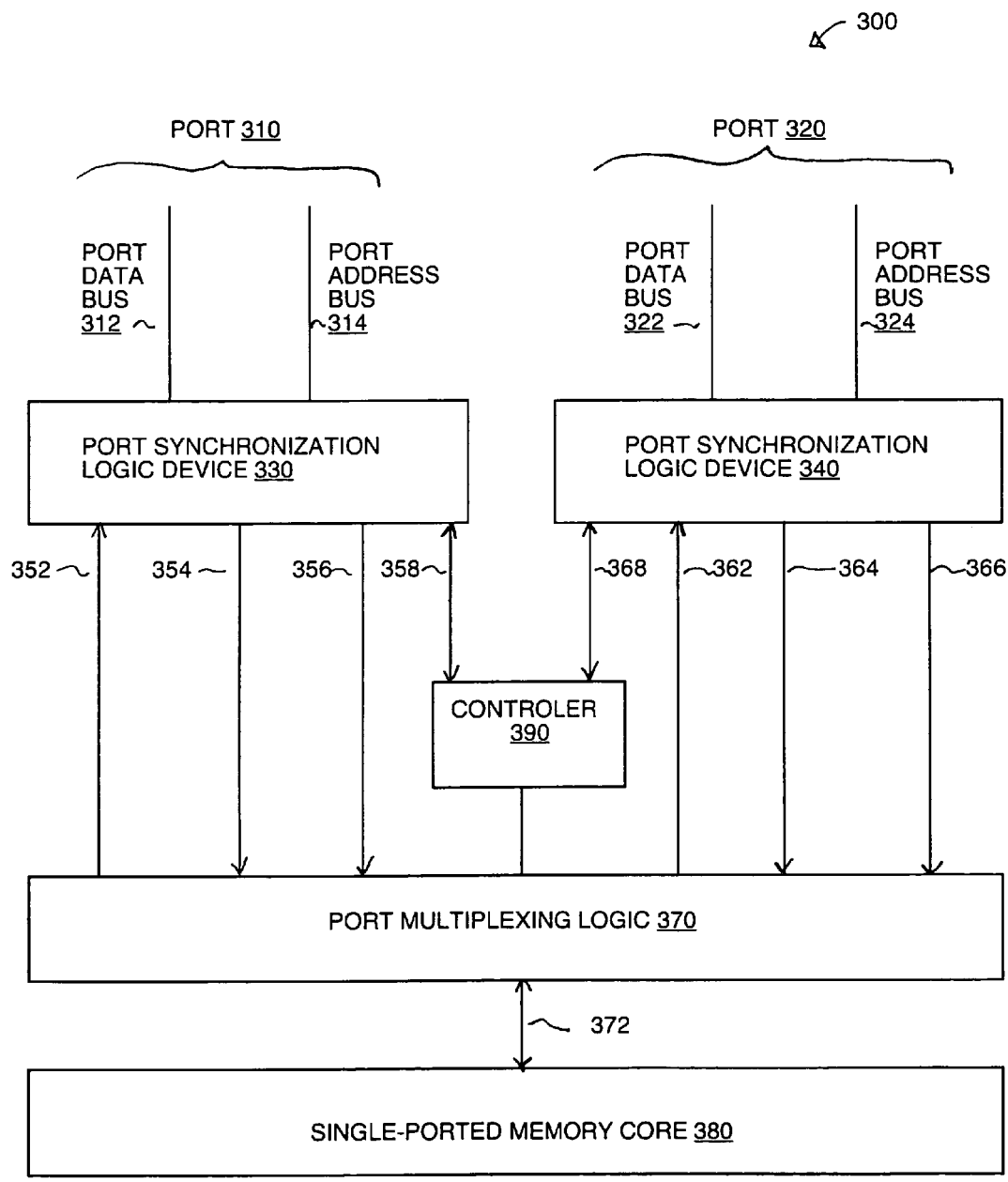
FIG. 3 depicts a memory circuit device that has the functionality of a dual-ported memory but which is constructed from single-ported memory according to one embodiment of the present invention.

FIG. 3 depicts a memory circuit device that has the functionality of a dual-ported memory but which is constructed from single-ported memory according to one embodiment of the present invention. As depicted in FIG. 3, memory circuit device 300 includes two port synchronization logic devices (330, 340), a port multiplexing logic 370, a controller 390, and a single-ported memory core 380.

According to one embodiment, both of the port synchronization logic devices (330, 340) communicate with respective ports (310, 320) which may operate at different and independent frequencies. For example, each of the respective ports (310, 320) may include respective buses (312, 322, 314, 324), such as a port data bus (312, 322) for receiving and outputting data, as well as a port address bus (314, 322) for receiving an address that data received on a port data bus (312, 322) may be ultimately stored at in the single-ported memory core 380.

According to another embodiment, device 300 has a port multiplexing logic 370 so that device 300 can operate with multiple ports (310, 320). According to one embodiment, port multiplexing logic 370 acts as a time division multiplexer (TDM) for data and addresses communicated between the port synchronization logic devices (330, 340) and the single-ported memory core 380. In one embodiment, the core frequency is twice that of the fastest port (310, 320) frequency. In this case, the multiplexing logic 370 may be enabled to "ping-pong" between serving the two ports (310, 320). Of course, other well known time multiplexing techniques could be employed for the other port frequencies.

In one embodiment, in the event that ports 310, 320 receive data simultaneously on the respective port data buses 312, 322, a controller 390 informs port multiplexing logic 370 which port data bus (312, 322) to receive data from first. For example, control signals 358 and 368 are for setting up the port multiplexing logic 370 through the controller 390. In yet another embodiment, as described above controller 390 may flip flop between receiving data from the port data lines 312, 322.

In yet another embodiment, the port synchronization logic devices (330, 340) synchronizes the information communicated between the ports (310, 320) and the single-ported memory core 380 by synchronizing the information between clocks associated with the ports (referred to hereinafter as "port clocks") and a clock associated with the single-ported memory core 380 (referred to hereinafter as a "core clock").

The device 300 may also include data read buses (352, 362) for communicating data from port multiplexing logic 370 to port synchronization logic devices (330, 340), data write buses (354, 364) for communicating data from port synchronization logic devices (330, 340) to port multiplexing logic 370, as well as address buses (356, 366) for communicating the address to port multiplexing logic 370 that the data from data write buses (354, 364) may ultimately be stored at in the single-ported memory core 380, according to another embodiment.

According to one embodiment, the bandwidth of address and data bus 372 for communicating between the port multiplexing logic 370 and the single-ported memory core 380 is at least the bandwidth of the combination of a first set of buses (352, 354, 356) and a second set of buses (362, 364, 366) for communicating between port synchronization logic devices (330, 340) and port multiplexing logic 370. In yet another embodiment, the bandwidth of address and data bus 372 for communicating between the port multiplexing logic 370 and the single-ported memory core 380 is at least twice the bandwidth of the highest of a first set of buses (352, 354, 356) and a second set of buses (362, 364, 366) for communicating between port synchronization logic devices (330, 340) and port multiplexing logic 370.

For at least the reasons discussed herein, the device 300 may be constructed with a single-ported memory core 380 to provide dual-ported functionality for multiple clock domains, which allows for random accesses as well as bi-directional data flow. In the case of device 300, the multiple clock domains are for the clocks associated with the ports 330, 340 and the single-ported memory core 380, according to one embodiment. The internal operation of the single-ported memory core 380 is transparent to a user, thus, the dual-ported device 300 allows concurrent read and/or write operations on each port (330, 340) in the multiple clock domains.

Figure 4:
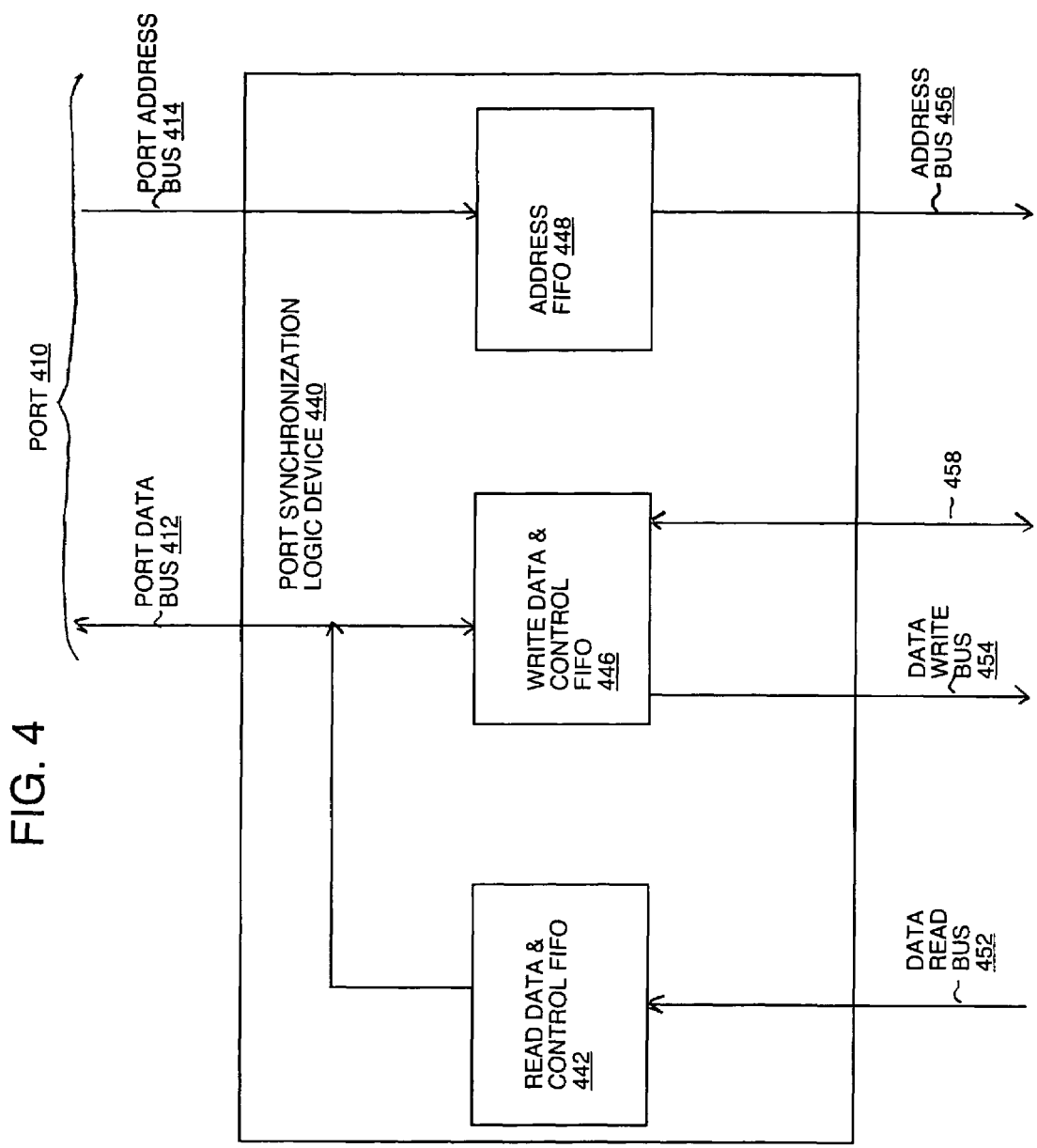
FIG. 4 depicts a port synchronization logic device according to one embodiment of the present invention.

FIG. 4 depicts a port synchronization logic device, e.g., device 330, according to one embodiment of the present invention. According to one embodiment, a port synchronization logic device may use FIFOs to synchronize information that is received and outputted. For example, the port synchronization logic device 440 includes a read data and control FIFO 442 for synchronizing data that is outputted, a write data and control FIFO 446 for synchronizing information that is received, and an address FIFO 448 for synchronizing addresses that are received. Typically, data and addresses are received and supplied at the port side according to the port clock rate, however, data and addresses on bus 454 and 456, as well as, data on bus 452 are at the core frequency.

According to one embodiment, data flows through device 440 in a bidirectional manner. For example, the port synchronization logic device 440 receives data from port 410's data bus 412 which it may communicate to a multiplexer, such as port multiplexing logic 370 depicted in FIG. 3, over a data write bus 454. In one embodiment, control signal 458 is for setting up a multiplexer, such as port multiplexing logic 370, through a controller, such as the controller 390. Ultimately the multiplexer 370 may communicate the received data to a single-ported memory core, such as single-ported memory core 380 depicted in FIG. 3 at the core frequency. Similarly, the port synchronization logic device 440 receives data from a single-ported memory core which it communicates to port 410's data bus 412 in data read mode.

In one embodiment, for a data read operation, an address is supplied from port 410 over bus 414 to FIFO 448, over bus 456 and the data supplied from core 380 is provided over bus 452 to FIFO 442 and to port bus 412. For a data write operation, addresses and data are supplied over buses 414 to FIFO 448 supplying data and addresses respectively over busses 454 and 456 to the core 380.

According to another embodiment, the bus 414 that addresses are received on is unidirectional. For example, when data is received on port data bus 412 the data may be ultimately stored on single-ported memory core 380 at the address received on port address bus 414.

In yet another embodiment, the FIFOs (442, 446, 448) are implemented with memory and/or synchronization registers. According to one embodiment, the read data and control FIFO 442 is only for receiving data from the data read bus 452. Similarly, according to one embodiment, the write data and control FIFO 446 is only for writing data to the data write bus 454.

Just as port clocks may be associated with ports 310, 320 in FIG. 3, a port clock may be associated with port 410 depicted in FIG. 4, according to one embodiment. According to another embodiment, the FIFOs (442, 446, 448) are used for synchronizing signals that cross the clock boundary between port 410 and a single-ported memory core. For example, when the port synchronization logic device 440 receives data from port 410 which it ultimately communicates to a single-ported memory core, write data and control FIFO 446 may synchronize the data from port 410's clock to the single-ported memory core's clock (referred to hereinafter as a "core clock"). The data may then be processed with respect to the core clock. Similarly, when the port synchronization logic device 440 receives addresses from port address bus 414, the address FIFO 446 may synchronize the addresses from port 410's clock to the core clock. Further, when the port synchronization logic device 440 receives data from a single-ported memory core which it communicates to port 410, the read data and control FIFO 442 may synchronize the data from the core's clock to port 410's clock.

Figure 5:
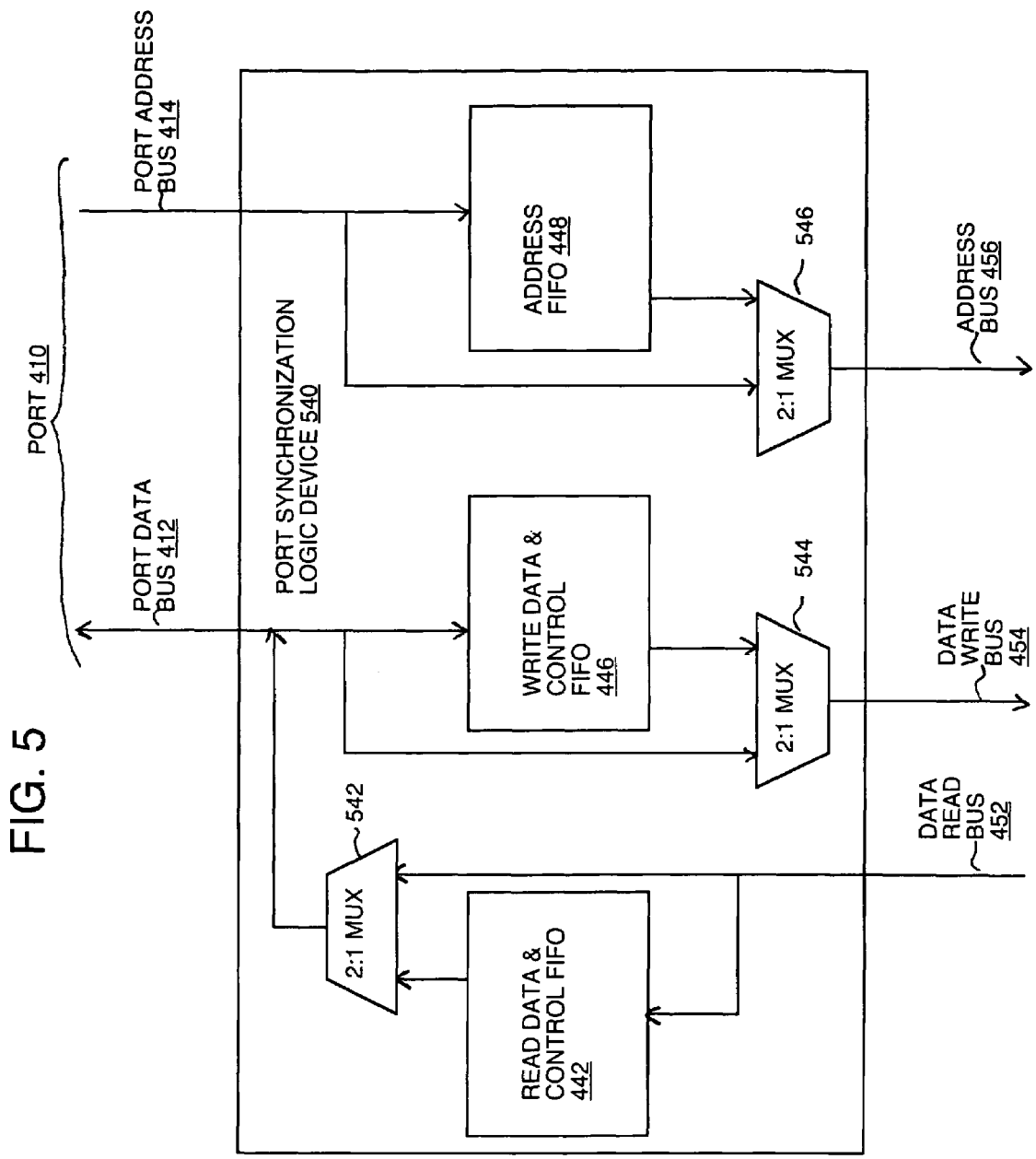
FIG. 5 depicts another port synchronization logic device according to another embodiment of the present invention.

FIG. 5 depicts a port synchronization logic device according to one embodiment of the present invention. The port synchronization logic device 540, as depicted in FIG. 5, is similar to port synchronization logic device 440, depicted in FIG. 4, except that device 540 optimizes for the situation where port 410's clock is half as fast as the core clock by using multiplexers (542, 544, 546) to bypass the FIFOs (442, 446, 448). This embodiment may be used when the port clocks and the core clock are generated from the same clock circuit. For example, if port 410's clock is from the same source as the core clock, then data from the buses (452, 412, 414) would flow to the respective multiplexers (542, 544, 546). However, if port 410's clock is not from the same source as the core clock, then data from the control lines (452, 412, 414) would flow to the FIFOs (442, 446, 448). According to one embodiment, signal control lines (not shown) for each multiplexer (542, 544, 546) select whether or not to bypass the FIFOs (442, 446, 448). These lines may be enabled via configuration states.

According to another embodiment, devices, such as devices 300, 440, and 540, could be implemented on a monolithic substrate for example a single "chip," or on multiple monolithic substrates on a board such as a PCB or in a package such as a multi-chip module. According to one embodiment, devices, such as devices 300, 440, and 540, could also be implemented as programmable logic circuitry, for example, on a field programmable gate array (FPGA) or a complex programmable logic device (CPLD), or on a mask\programmable gate array.

Various embodiments of the present invention use a single-ported memory, thus, allowing a smaller and more economical die size for a smaller density than the conventional dual-ported memories. A designer can develop a controller that can be reused over technologies, and eliminates the cost of developing a dedicated dual-ported memory. This invention also enables a designer and/or vendor of dual-ported memories to, among other things, fill out a product portfolio to allow lower cost points, and also to scale up to larger port counts.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than re expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

The foregoing descriptions of specific embodiments of the present invention, a method and system for providing the functionality of dual-ported memory using single-ported memory thereby dual port operations can be emulated for applications operating according to different clock domains in a cost effective way, have been presented for purpose of illustration and description. They are not intended to be exhaustive or to limit the invention to the precise form disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A memory device comprising:
   a first and a second port synchronization logic devices associated with a first and second ports, respectively;
   a port multiplexing logic; and
   a single-ported memory core coupled to the port multiplexing logic, wherein the first and second port synchronization logic devices synchronize information communicated between the first and second ports associated with the first and second port synchronization logic devices and the single-ported memory core by synchronizing information between port frequencies and a core frequency that is associated with the single-ported memory core;
   wherein the port multiplexing logic acts as a time division multiplexer (TDM) for the information communicated between the first and second port synchronization logic devices and the single-ported memory core.

2. A memory device as described in claim 1 wherein the core frequency is at least twice that of the fastest of the port frequencies.

3. A memory device as described in claim 1 wherein the first port synchronization logic device comprises one or more FIFOs for synchronizing the information between a first port frequency that is associated with the first port synchronization logic device and the core frequency.

4. A memory device as described in claim 3 wherein at least part of the information is data from the single-ported memory core and wherein one of the FIFOs is a read data and control FIFO for synchronizing the data from the single-ported memory core.

5. A memory device as described in claim 3 wherein at least part of the information is data, from the first port, that is to be written to the single-ported memory core and wherein one of the FIFOs is a write data and control FIFO for synchronizing the data from the first port.

6. A memory device as described in claim 3 wherein at least part of the information is an address from the first port and wherein one of the FIFOs is an address FIFO for synchronizing the address from the first port.

7. A memory device as described in claim 1 wherein the first port synchronization logic device further comprises one or more multiplexers used to bypass the synchronization of the information communicated between the ports and the single-ported memory core.

8. A memory device as described in claim 7 wherein a write data and control FIFO is bypassed.

9. A memory device as described in claim 7 wherein a read data and control FIFO is bypassed.

10. A memory device as described in claim 7 wherein the port frequencies and the core frequency are all derived from a common clock generation circuit.

11. A dual ported memory device comprising:
    a single port memory core operable at a first frequency;
    a multiplexer logic coupled to said single port memory core;
    a first port synchronizing logic coupled to a first port and coupled to said multiplexer logic; and
    a second port synchronizing logic coupled to a second port and coupled to said multiplexer logic wherein said first and second synchronizing logic synchronizes information flow between said memory core and said first and second ports;
    wherein said first port is operable at a second frequency and wherein said second port is operable at a third frequency and wherein said second and third frequencies are independent.

12. A dual ported memory device as described in claim 11 wherein said first frequency is at least twice that of the fastest of the second and third frequencies.

13. A dual ported memory device as described in claim 11 wherein said first port synchronizing logic comprises:
    a read data and control FIFO circuit;
    a write data and control FIFO circuit; and
    an address FIFO circuit.

14. A dual ported memory device as described in claim 13 wherein said second port synchronizing logic comprises:
    a read data and control FIFO circuit;
    a write data and control FIFO circuit; and
    an address FIFO circuit.

15. A dual ported memory device as described in claim 13 wherein said first port synchronizing logic comprises bypass logic for bypassing one of said FIFO circuits according to a configuration select line.

16. A dual ported memory device as described in claim 15 wherein said bypass logic is a multiplexer circuit.

17. A method for causing a memory device to provide the functionality of a dual-ported memory using single-ported memory for multiple frequencies, the method comprising:
    receiving information at a first and second ports that are associated respectively with a first and second port synchronization logic devices;
    communicating the information from the first and second ports, respectively, to the first and second port synchronization logic devices;
    synchronizing the information, between port frequencies and a core frequency associated with a single-ported memory core, at the first and the second port synchronization logic devices;
    communicating the information from the first and second port synchronization logic devices to a port multiplexing logic that acts as a time division multiplexer (TDM) for the information; and
    communicating the information from the TDM to the single-ported memory core.

18. A method as described in claim 17, wherein the core frequency associated with the single-ported memory core is at least twice that of the fastest of the port frequencies.

* * * * *